United States Patent
Kitamura et al.

(10) Patent No.: US 6,687,268 B2
(45) Date of Patent: Feb. 3, 2004

(54) SURFACE EMITTING LASER AND PHOTODIODE, MANUFACTURING METHOD THEREFOR, AND OPTOELECTRIC INTEGRATED CIRCUIT USING THE SURFACE EMITTING LASER AND THE PHOTODIODE

(75) Inventors: Shojiro Kitamura, Nagano-ken (JP); Tsugio Ide, Nagano-ken (JP); Atsushi Harada, Suwa (JP); Takeo Kaneko, Misoto-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/096,957

(22) Filed: Mar. 14, 2002

(65) Prior Publication Data

US 2002/0137245 A1 Sep. 26, 2002

(30) Foreign Application Priority Data

Mar. 26, 2001 (JP) ........................................ 2001-088822

(51) Int. Cl.$^7$ .................................................. H01S 3/10
(52) U.S. Cl. ........................................... 372/22; 372/26
(58) Field of Search .............................. 372/46, 50, 96; 257/81, 22; 438/26

(56) References Cited

U.S. PATENT DOCUMENTS 5,703,898 A * 12/1997 Ogura ........................ 372/96
5,896,408 A * 4/1999 Corzine et al. .............. 372/46
5,977,565 A * 11/1999 Ishikawa et al. ............. 257/81
5,978,401 A * 11/1999 Morgan ...................... 372/50
6,255,129 B1 * 7/2001 Lin ............................. 438/26

FOREIGN PATENT DOCUMENTS

JP          A-8-116131          5/1996

* cited by examiner

Primary Examiner—Paul Ip
Assistant Examiner—Tuan Nguyen
(74) Attorney, Agent, or Firm—Oliff & Berridge, PLC

(57) ABSTRACT

The present invention provides a surface emitting laser and a photodiode which permit secure mounting even in mounting by flip chip bonding, and high-speed modulation. The present invention also provides a manufacturing method therefor and an optoelectric integrated circuit using the surface emitting laser and the photodiode. Semiconductor stacked layers stacked on a semiconductor substrate have a light emitting portion and a reinforcing portion formed with a recessed portion provided therebetween, and a p-type ohmic electrode and an n-type ohmic electrode are formed on the top of the reinforcing portion. The p-type ohmic electrode is electrically connected to a p-type contact layer through a contact hole vertically formed in polyimide buried in the recessed portion to permit supply of a current to the light emitting portion in the thickness direction. The recessed portion has a groove formed to reach the semiconductor substrate, thereby suppressing the parasitic capacity between the p-type ohmic electrode and the n-type ohmic electrode.

4 Claims, 6 Drawing Sheets

SURFACE EMITTING LASER AND PHOTODIODE, MANUFACTURING METHOD THEREFOR, AND OPTOELECTRIC INTEGRATED CIRCUIT USING THE SURFACE EMITTING LASER AND THE PHOTODIODE

BACKGROUND OF THE INVENTION

1. Field of Invention

The present invention relates to a surface emitting laser used for digital optical communication, and a method of manufacturing the same.

2. Description of Related Art

A vertical cavity surface emitting laser (VCSEL) generally includes a convex light emitting portion formed by vertically etching semiconductor stacked layers formed by laminating an active layer, and a distributed reflecting layer to emit a laser beam from a light emission plane through an opening formed in the upper surface of the light emitting portion. In this laser, in order to emit a laser beam, upper and lower electrodes are formed above and below the semiconductor stacked layers including the light emitting portion, through insulating layers, and a voltage is applied so that a current flows through, in the thickness direction of the light emitting portion, to supply a current to the active layer.

However, in the surface emitting layer having the above construction, the upper and lower electrodes formed on the upper and lower surfaces, and the insulating thin layers formed between the electrodes, form a capacitor, and thus a lot of time is required for charging and discharging due to the high parasitic capacity of the capacitor. Therefore, the surface emitting layer has difficulty in high-speed modulation.

Thus, for example, a method for forming an insulating thick layer made of a polyimide resin between upper and lower electrodes has been proposed, as disclosed in Japanese Unexamined Patent Application Publication No. 8-116131. In this proposal, a recessed portion that is formed around a projecting portion, serving as a light emitting portion, is filled with a polyimide resin to remove a step formed between the recessed portion and the projecting portion, and an electrode is stacked on the upper surface of the polyimide resin.

In the surface emitting laser having the above construction, the distance between the upper and lower electrodes is increased by the polyimide resin to decrease the parasitic capacity, thereby permitting high-speed modulation in the surface emitting layer.

SUMMARY OF THE INVENTION

In order to increase the density of the surface emitting laser having the above construction, electrodes and other semiconductor elements are frequently mounted by flip chip bonding including soldering with solder bumps, or the like.

However, in the surface emitting laser having the above construction, the electrode is stacked on the upper surface of the polyimide resin which is softer than semiconductor materials, thereby possibly causing deformation of the electrode surface, such as depression, during mounting. This results in the electrode becoming broken, or the surface emitting laser not being strongly mounted.

Since a laser beam is emitted via the upper and lower electrodes formed to hold the semiconductor stacked layers therebetween, contact with an electrode at the back of a semiconductor substrate must be achieved by wire bonding or the like.

The present invention addresses the above-described situation, and provides a surface emitting laser permitting secure and strong mounting even in mounting by flip chip bonding, and high-speed modulation, and a method of manufacturing the same.

A surface emitting laser of the present invention includes a semiconductor substrate, semiconductor stacked layers stacked on the substrate and divided into a light emitting portion and a reinforcing portion through a recessed portion, an insulating material buried in the recessed portion, and a pair of electrodes that apply a voltage to pass a current in the thickness direction of the light emitting portion. The pair of electrodes have an external connecting portion formed on the upper surface of the reinforcing portion.

In this construction, the pair of electrodes is formed to have the external connecting portion formed on the upper surface of the reinforcing portion including the semiconductor stacked layers harder than a conventional polyimide resin, and thus deformation, such as recession of the electrode surfaces, can be suppressed even in mounting by flip chip bonding. Therefore, it is possible to address or resolve the problem of peeling of the electrodes, and securely mount the surface emitting laser.

Exemplary embodiments include the following.

The pair of electrodes is formed on the upper surface of the reinforcing portion coplanar with the electrodes, thereby eliminating the need to achieve contact with an electrode on the back by wire bonding or the like. This is effective in decreasing the complexity of mounting of the surface emitting laser.

Furthermore, in the surface emitting laser, one of the pair of electrodes is electrically connected to the lower end of the light emitting portion through a contact hole vertically extending in the insulating material.

Since one of the pair of electrodes is electrically connected to the lower end of the light emitting portion through the contact hole vertically extending in the insulating material, a current can be supplied in the vertical direction, i.e., in the thickness direction, of the light emitting portion, even when the pair of electrodes is formed on the same plane.

The bottom of the recessed portion reaches the surface of the semiconductor substrate over the entire length of the bottom in order to attain non-conduction between the lower end of the light emitting portion and the lower end of the reinforcing portion.

Since the bottom of the recessed portion is formed to reach the surface of the semiconductor substrate over the entire length of the bottom to attain non-conduction between the lower end of the light emitting portion and the lower end of the reinforcing portion, a parasitic capacity produced between the pair of electrodes can be suppressed. Namely, the surface emitting laser can perform higher-speed modulation.

A method of manufacturing a surface emitting laser of the present invention includes vertically etching semiconductor stacked layers formed on a semiconductor substrate to form a recessed portion to divide the semiconductor stacked layers into a light emitting portion and a reinforcing portion, further vertically etching the bottom of the recessed portion until the bottom reaches the surface of the semiconductor substrate over the whole length of the bottom to form a groove to attain non-conduction between the lower end of the light emitting portion and the lower end of the reinforcing portion, filling the recessed portion including the groove with an insulating material, forming a contact hole in the insulating material so that the contact hole vertically extends and connects to the lower end of the light emitting portion, and forming electrodes on the upper surface of the reinforcing portion so that the electrodes are respectively electrically connected to the upper ends of the light emitting portion and the contact hole.

In the step of forming the groove, the groove is formed so that a portion that is connected to the lower end of the contact hole remains at the lower end of the light emitting portion.

Since the groove is formed so that the portion that is connected to the lower end of the contact hole remains at the lower end of the light emitting portion, one of the electrodes can be electrically connected to the lower end of the light emitting portion through the contact hole. Therefore, even when a pair of electrodes is formed on the upper surface of the reinforcing portion, a current can be supplied in the thickness direction of the light emitting portion.

The reinforcing portion includes a portion of the semiconductor stacked layers stacked on the upper surface of the semiconductor substrate, and does not function as the light emitting portion. The portion is removed by etching in manufacturing a conventional surface emitting laser. In the present invention, the reinforcing portion, which has been conventionally removed, is left, and a pair of electrodes is formed on the reinforcing portion to have an external connecting portion.

A photodiode includes a semiconductor substrate, semiconductor stacked layers divided into a light receiving portion and a reinforcing portion by a recessed portion, an insulating material buried in the recessed portion, and a pair of electrodes that detect a current flowing in the thickness direction of the light receiving portion due to incidence of light. The pair of electrodes has an external connecting portion formed on the upper surface of the reinforcing portion.

Since the pair of electrodes is formed on the upper surface of the reinforcing portion including the semiconductor stacked layers harder than conventional polyimide resins so as to have an external connecting portion, deformation, such as recession of the electrode surfaces, can be suppressed even in mounting by flip chip bonding. It is thus possible to address or resolve the problem of peeling of the electrodes, and the like, and securely mount the photodiode.

Since the pair of electrodes is formed on the upper surface of the reinforcing portion coplanar with the electrodes, it is unnecessary to attain contact with an electrode on the back by wire bonding or the like. This is effective in decreasing the complexity of mounting of the photodiode.

In the photodiode, one of the pair of electrodes is electrically connected to the lower end of the light receiving portion through the contact hole vertically extending in the insulating material.

Since one of the pair of electrodes is electrically connected to the lower end of the light receiving portion through the contact hole vertically extending in the insulating material, a current flowing in the vertical direction, i.e., the thickness direction, can be detected, even when the pair of electrodes is formed in the same plane.

The bottom of the recessed portion reaches the surface of the semiconductor substrate over the entire length of the bottom in order to attain non-conduction between the lower end of the light receiving portion and the lower end of the reinforcing portion.

Since the bottom of the recessed portion is formed to reach the surface of the semiconductor substrate over the entire length of the bottom to attain electrical non-conduction between the lower end of the light receiving portion and the lower end of the reinforcing portion, a parasitic capacity between the pair of electrodes can be suppressed. Namely, the bandwidth of the photodiode can be further widened.

A method of manufacturing a photodiode includes vertically etching semiconductor stacked layers formed on a semiconductor substrate to form a recessed portion to divide the semiconductor stacked layers into a light receiving portion and a reinforcing portion, further vertically etching the bottom of the recessed portion until the bottom reaches the surface of the semiconductor substrate over the whole length of the bottom to form a groove to attain non-conduction between the lower end of the light receiving portion and the lower end of the reinforcing portion, filling the recessed portion including the groove with an insulating material, forming a contact hole in the insulating material so that the contact hole vertically extends and connects to the lower end of the light receiving portion, and forming electrodes on the upper surface of the reinforcing portion so that the electrodes are respectively electrically connected to the upper ends of the light receiving portion and the contact hole.

In the step of forming the groove, the groove is formed so that a portion connected to the lower end of the contact hole remains at the lower end of the light receiving portion.

Since the groove is formed so that the portion connected to the lower end of the contact hole remains at the lower end of the light receiving portion, one of the electrodes can be electrically connected to the lower end of the light receiving portion through the contact hole. Therefore, even when a pair of electrodes is formed on the upper surface of the reinforcing portion, a current flowing in the thickness direction of the light receiving portion can be detected.

An optoelectric integrated circuit includes at least an optical waveguide, a mirror for incidence into the optical waveguide, a mirror for emission from the optical waveguide, and electric wiring. The surface emitting laser of the invention, a laser driving circuit that drives the surface emitting laser, the photodiode of the invention, and an amplifier circuit that detects signals from the photodiode are mounted on the electric wiring by flip chip bonding.

Since the surface emitting laser of the invention, the laser driving circuit that drives the surface emitting laser, the photodiode of the invention, and the amplifier circuit that detects signals from the photodiode are mounted on the electric wiring by flip chip bonding, an optoelectric integrated circuit having high reliability can be manufactured.

DETAILED DESCRIPTION OF PREFERRED EMBODIMENTS

An embodiment of the present invention will be described with reference to the drawings.

Figure 1:
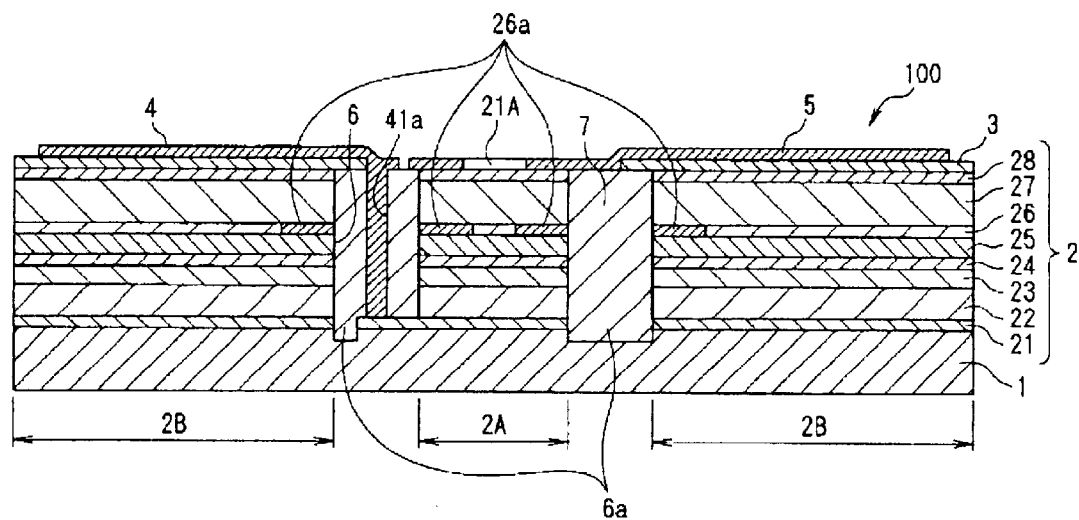
FIG. 1 is a sectional view showing a surface emitting laser according to the present invention.
Figure 2:
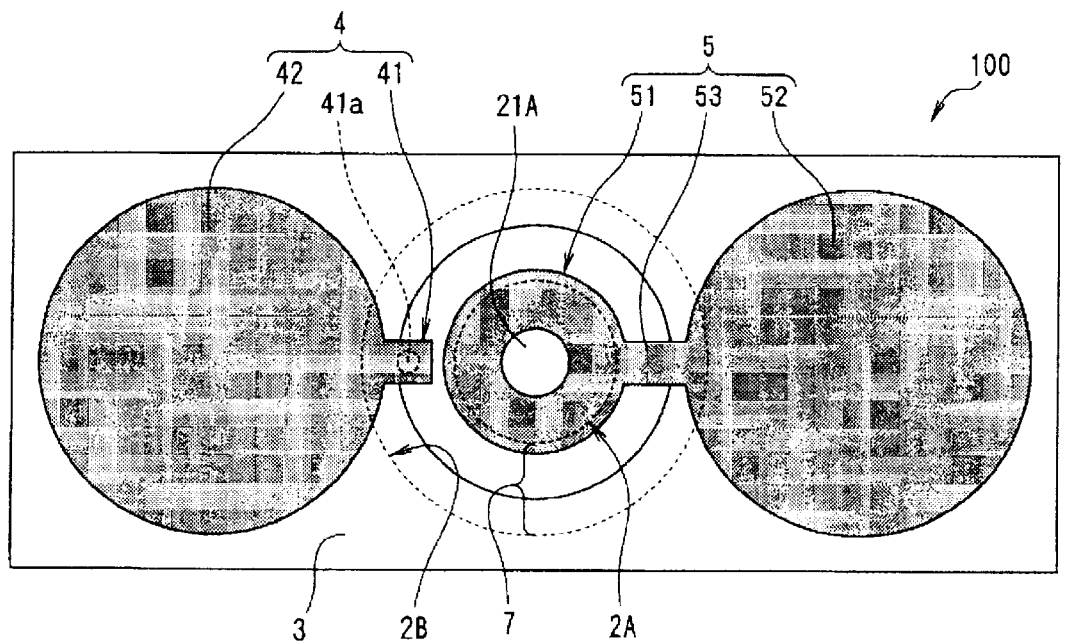
FIG. 2 is a plan view showing the surface emitting laser according to the present invention.

FIG. 1 is a sectional view showing a surface emitting laser according to the present invention. FIG. 2 is a plan view showing the surface emitting laser according to the present invention.

As shown in FIGS. 1 and 2, a surface emitting laser 100 according to the present invention includes a high-resistance semiconductor substrate 1 made of GaAs, semiconductor stacked layers 2 provided on the upper surface of the semiconductor substrate 1 and divided into a light emitting portion 2A and a reinforcing portion 2B through a recessed portion 6, an insulating layer 3 provided on the upper surface of the semiconductor stacked layers 2, and a p-type ohmic electrode 4 and an n-type ohmic electrode 5 which are provided on the upper surface of the insulating layer 3.

The semiconductor stacked layers 2 includes a p-type contact layer 21, a p-type DBR mirror layer 22, a p-type clad layer 23, an active layer 24, a n-type clad layer 25, a current narrowing layer 26, a n-type DBR mirror layer 27, and a n-type contact layer 28, which are stacked layers in order from the top of the semiconductor substrate 1.

The p-type contact layer 21 is made of p-type GaAs. The p-type DBR mirror layer 22 includes a multilayer film formed by alternately laminating 30 pairs of p-type AlAs layer and p-type $Al_{0.15}Ga_{0.85}As$ layer. The p-type clad layer 23 is made of p-type $Al_{0.5}Ga_{0.5}As$. The active layer 24 includes a GaAa well layer and an $Al_{0.3}Ga_{0.7}As$ barrier layer, the well layer having a multiquantum well structure including three layers. The n-type clad layer 25 is made of n-type $Al_{0.5}Ga_{0.5}As$. The current narrowing layer 26 includes an n-type AlAs layer. The n-type DBR mirror layer 27 includes a multilayer film formed by alternately laminating 25 pairs of n-type AlAs layer and n-type $Al_{0.15}Ga_{0.85}As$ layer. The n-type contact layer 28 is made of n-type $Al_{0.15}Ga_{0.85}As$.

The semiconductor stacked layers 2 formed by laminating in turn these layers are divided into the columnar light emitting portion 2A functioning as a resonator, and the peripheral reinforcing portion 2B with the ring-shaped recessed portion 6 provided therebetween. Also, a groove 6a is formed at the bottom of the recessed portion 6 so as to reach the semiconductor substrate 1 over the entire periphery thereof except a portion extending from the periphery of the light emitting portion 2A and having a substantially rectangular planar shape.

Although, in this embodiment, the light emitting portion 2A has a circular planar shape, the light emitting portion is not limited to this shape, and any desired shape, such as a polygonal shape or the like, can be used. Although the portion where the groove 6a is not formed has a substantially rectangular planar shape, the portion is not limited to this shape, and any desired shape, such as a circular or polygonal shape, or the like, can be used.

The recessed portion 6 including the groove 6a is filled with a polyimide resin as an insulating material 7. Furthermore, a contact hole 41a is formed in the polyimide resin. The contact hole 41a is filled with a conductive material.

The current narrowing layer 26 of the light emitting portion 2A lies within a circle having a predetermined diameter and positioned at the center of the light emitting portion 2A, and an insulator layer 26a made of aluminum oxide is formed outside of the circle. Similarly, the current narrowing layer 26 of the reinforcing portion 2B includes an insulator layer 26a formed in a peripheral region of several mm from the recessed portion. By forming the insulator layers 26a, a current from the p-type ohmic electrode 4 can be concentrated in the central portion of the light emitting portion 2A.

The insulating layer 3 is formed on the upper surface of the n-type contact layer 28 in the reinforcing portion 2B except a portion of the light emitting portion 2A, where the n-type contact layer 28 is exposed.

The p-type ohmic electrode 4 includes a contact portion 41, and a circular electrode pad portion 42 connected to the contact portion 41. The contact portion 41 is placed into contact with the polyimide resin buried in the recessed portion 6 formed in the periphery of the light emitting portion 2A, and contact with the p-type contact layer 21 through the contact hole 41a vertically extending in the polyimide resin. The electrode pad portion 42 is formed on the upper surface of the n-type contact layer 28 of the reinforcing portion 2B through the insulating layer 3.

Namely, the p-type ohmic electrode 4 is placed into contact with the p-type contact layer 21 through the contact hole 41a extending downward from the contact portion 41. The material of the p-type ohmic electrode 4 includes chromium and a gold-zinc alloy.

The n-type ohmic electrode 5 includes a contact portion 51, a circular electrode pad portion 52 and a stripe-shaped connecting portion 53 to connect the contact portion 51 and the circular electrode pad portion 52. The contact portion 51 comes into contact with the n-type contact layer 28 of the light emitting portion 2A, and has a ring-like planar shape. The hole of the ring serves as an emission hole of the surface emitting laser 100. The electrode pad portion 52 is formed on the upper surface of the n-type contact layer 28 of the reinforcing portion 2B through the insulating layer 3. The connecting portion 53 connects the peripheries of the contact portion 51 and the electrode pad portion 52 at the shortest distance, and comes into contact with the polyimide resin.

In other words, the n-type ohmic electrode 5 is placed into contact with the n-type contact layer 28 through the contact portion 51. The material of the n-type ohmic electrode 5 includes a gold-germanium alloy.

In the surface emitting laser 100 having the above construction, a vertical cavity surface emitting layer (VCSEL) is formed by the p-type contact layer 21, the p-type DBR mirror layer 22, the p-type clad layer 23, the active layer 24, the n-type clad layer 25, the current narrowing layer 26, the n-type DBR mirror layer 27, the n-type contact layer 28, the p-type ohmic electrode 4 and the n-type ohmic electrode 5. When a voltage is applied across both electrodes, a current flows in the thickness direction of the light emitting portion 2A via the n-type ohmic electrode 5 formed on the upper surface of the light emitting portion 2A, and the p-type ohmic electrode 4 electrically connected to the lower end of the light emitting portion 2A through the contact hole 41a. The current is supplied to the active layer 24 to emit a laser beam upward in the vertical direction from the light emitting portion 2A through the light emission plane 21 A formed open at the top of the light emitting portion 2A.

Figure 9:
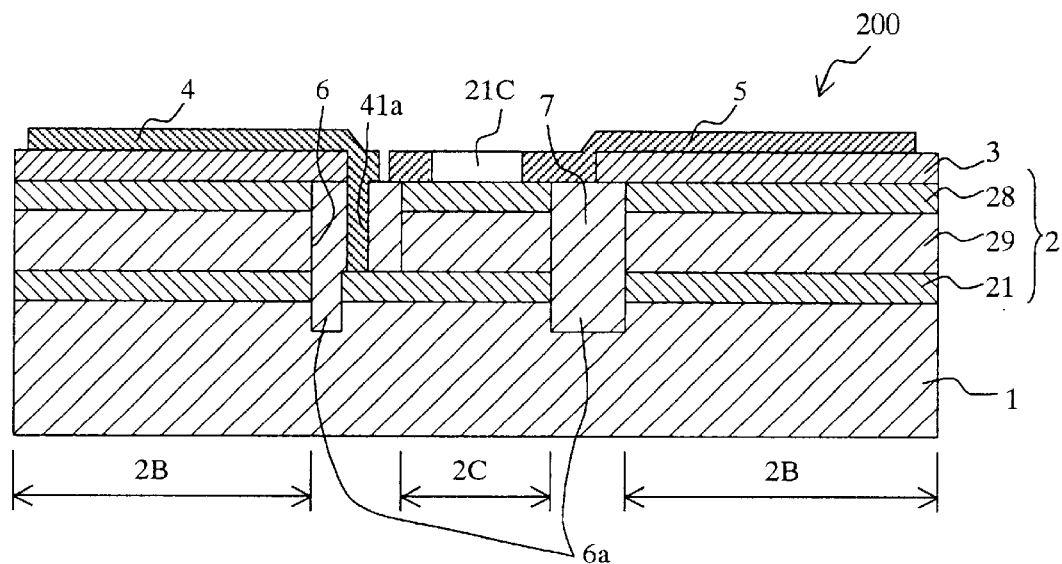
FIG. 9 is a sectional view showing a photodiode according to the present invention.
Figure 10:
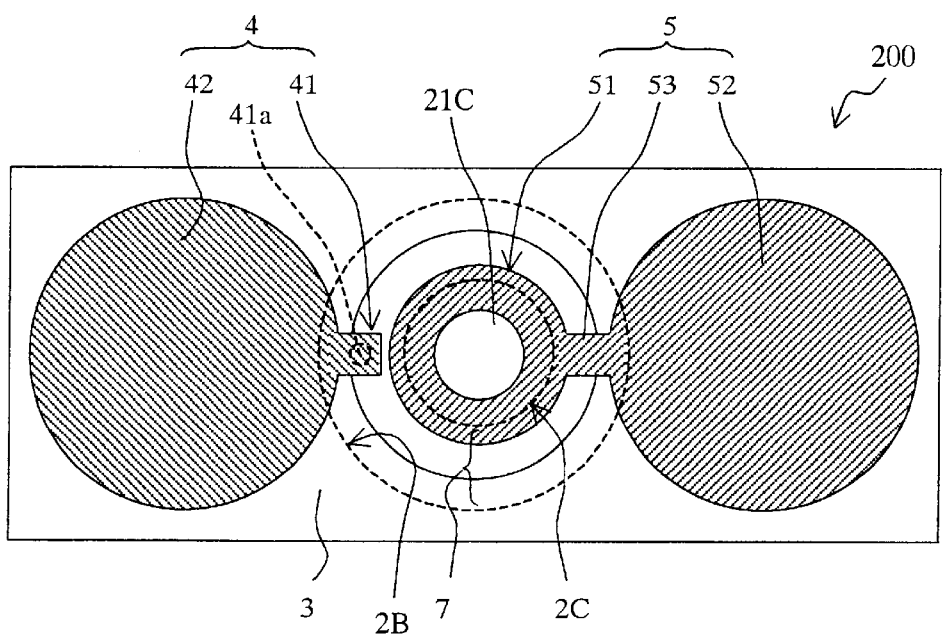
FIG. 10 is a plan view showing the photodiode according to the present invention.

FIG. 9 is a sectional view showing a photodiode according to the present invention. FIG. 10 is a plan view showing the photodiode according to the present invention. The same components as the surface emitting laser 100 of the above embodiment are denoted by the same reference numerals, and a detained description is omitted.

As shown in FIGS. 9 and 10, a photodiode 200 according to the present invention includes a high-resistance semiconductor substrate 1 made of GaAs, semiconductor stacked layers 2 provided on the upper surface of the semiconductor substrate 1 and divided into a light receiving portion 2C and a reinforcing portion 2B through a recessed portion 6A, an insulating layer 3 provided on the upper surface of the semiconductor stacked layers 2, and a p-type ohmic electrode 4 and a n-type ohmic electrodes 5 which are provided on the upper surface of the insulating layer 3.

The photodiode 200 is different from the surface emitting laser 100 of the above embodiment in that the semiconductor stacked layers 2 include a p-type contact layer 21, a light absorption layer 29, and an n-type contact layer 28, which are stacked in order from the top of the semiconductor substrate 1.

The p-type contact layer 21 is made of p-type GaAs. The light absorption layer 29 is made of GaAa. The n-type contact layer 28 is made of n-type $Al_{0.15}Ga_{0.85}As$.

In the photodiode 200 having the above construction, the p-type contact layer 21, the light absorption layer 29, the n-type contact layer 28, the p-type ohmic electrode 4 and the n-type ohmic electrode 5 constitute a PIN-type photodiode. In this photodiode, light incident from a light receiving plane 21C formed at the top of a light receiving portion 2C is absorbed by the light absorption layer 29 to produce a current. The current is then detected by the amplifier circuit 9 described below through the n-type ohmic electrode 5 and the p-type ohmic electrode 4 electrically connected to the lower end of the light receiving portion 2C through the contact hole 41a to detect the quantity of light incident on the light receiving plane 21C.

Figure 11:
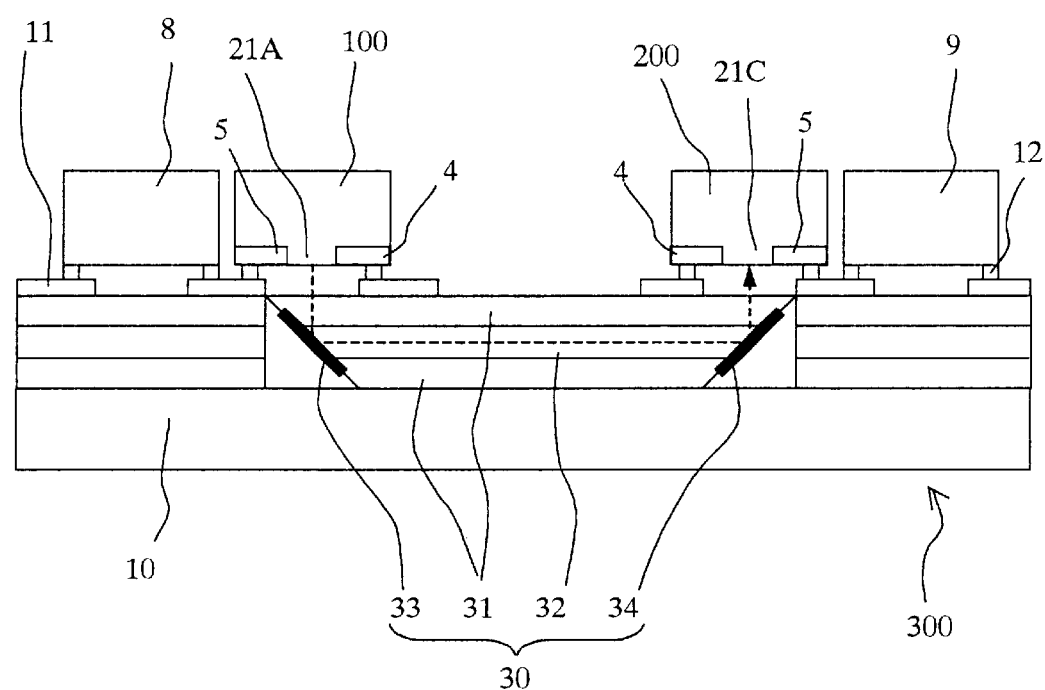
FIG. 11 is a sectional view showing a optoelectric integrated circuit according to the present invention.

FIG. 11 is a sectional view showing a optoelectric integrated circuit 300 using the surface emitting laser 100 and the photodiode 200 according to the present invention.

As shown in FIG. 11, the optoelectric integrated circuit 300 includes a substrate 10, an optical waveguide 30 provided on the upper surface of the substrate 10, electric wiring 11, the surface emitting laser 100 mounted on the electric wiring 11 by flip chip bonding, a laser driving circuit 8, the photodiode 200 and the amplifier circuit 9.

The optical waveguide 30 is a polymer-type optical waveguide including a core 32 with both sides in the thickness direction and both sides in the width direction being covered with a clad 31. Also, a mirror 33 is provided at the upstream-side end of both ends of the optical waveguide 30 in the optical waveguide direction in order to perform a 90° change in the direction of the laser irradiated from the light emission plane 21 A of the surface emitting laser 100 in the thickness direction of the substrate 10 to a direction along the surface of the substrate 10, thereby transmitting the laser through the core 32. Also, a mirror 34 is provided at the downstream-side end of both ends of the optical waveguide 30 in the optical waveguide direction in order to perform a 90° change in the direction of the laser transmitted through the core 32 and enter the laser into the light receiving plane 21C of the photodiode 200.

The electric wiring 11 is formed on the optical waveguide 30 in order to connect the surface emitting laser 100 and the laser driving circuit 8, or to connect the photodiode 200 and the amplifier circuit 9. Therefore, stat bumps 12 are formed on the p-type ohmic electrodes 4 and the n-type ohmic electrodes 5 of the surface emitting laser 100 and the photodiode 200, and on electrodes of the laser driving circuit 8 and the amplifier circuit 9, which are not shown in the drawing, in order to mount these elements on the electric wiring 11 by flip chip bonding.

In the surface emitting laser 100 or the photodiode 200 having the above construction, the electrode pad portion 42 or 52 is formed at the top of the reinforcing portion 2B of the semiconductor stacked layers 2, and thus deformation, such as recession of the electrode pad portion 42 or 52, or the like, can be suppressed even when the stat bumps 12 for flip chip bonding are formed on the upper surface of the electrode pad portion 42 or 52. Therefore, it is possible to address or resolve the problem of peeling of the electrode pad portion 42 or 52, and to perform manufacture of the surface emitting layer 100 or the photodiode 200 with high reliability so as to permit secure mounting on the optoelectric integrated circuit 300, thereby producing a highly reliable optoelectric integrated circuit 300.

Furthermore, the portion of the semiconductor stacked layers 2, which has been conventionally removed by etching, is left as the reinforcing portion 2B to permit the easy and secure manufacture of the surface emitting layer 100 or the photodiode 200 with high strength that is sufficient to mount by flip chip bonding.

Furthermore, the p-type ohmic electrode 4 of the pair of electrodes is electrically connected to the lower end of the light emitting portion 2A or the light receiving portion 2C through the contact hole 41a, and thus a current can be supplied in the thickness direction of the light emitting portion 2A, or a current is taken out from the light receiving portion 2C, even when the pair of electrodes is formed on the top of the reinforcing portion 2B. In this way, by forming the pair of electrodes on the top of the reinforcing portion 2B, contact need not be achieved between the electrodes by wire bonding after mounting by flip chip bonding. This is effective to reduce the complexity of mounting of the surface emitting laser 100 or the photodiode 200. Also, connection between the electrodes of the laser driving circuit 8 and the surface emitting laser 100, or connection between the electrodes of the photodiode 200 and the amplifier circuit 9 on the optoelectric integrated circuit 300 can be shortened, thereby enabling effective high-speed modulation in the surface emitting laser 100 or widening of the bandwidth of the photodiode 200.

Furthermore, the groove 6a is formed at the bottom of the recessed portion 6 formed around the light emitting portion 2A or the light receiving portion 2C so as to reach the semiconductor substrate 1 over the entire periphery thereof, and thus the p-type ohmic electrode 4 electrically connected to the p-type contact layer 21 through the contact hole 41a is electrically connected only to the lower end of the light emitting portion 2A or the light receiving portion 2C. Therefore, the parasitic capacity between the p-type ohmic electrode 4 and the n-type ohmic electrode 5 can be suppressed to permit high-speed modulation in the surface emitting laser 100 or further widening of the bandwidth of the photodiode 200.

Next, a method of manufacturing the surface emitting laser 100 according to an embodiment of the present invention will be described with reference to FIGS. 3 to 8. Each of FIGS. 3 to 8 is a sectional view illustrating a step of manufacturing the surface emitting laser 100 according to the present invention.

Figure 3:
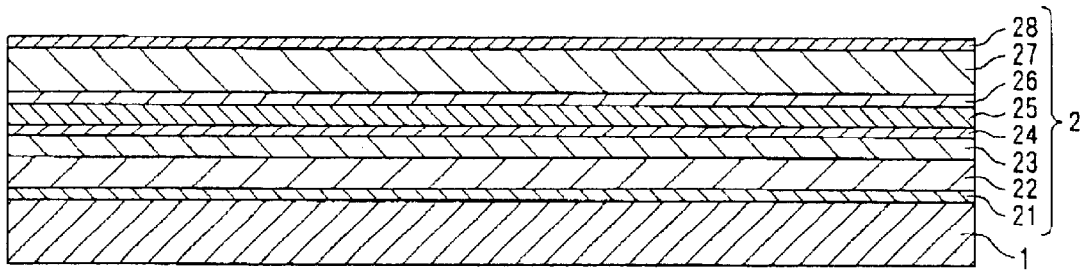
FIG. 3 is a sectional view illustrating a step for manufacturing a surface emitting laser according to the present invention.

First, as shown in FIG. 3, the p-type contact layer 21, the p-type DBR mirror layer 22, the p-type clad layer 23, the active layer 24, the n-type clad layer 25, the current narrowing layer 26, the n-type DBR mirror layer 27 and the n-type contact layer 28 are stacked in order on the high-resistance semiconductor substrate 1 made of GaAs.

The semiconductor stacked layers 2 may be formed by epitaxial growth by a metal organic vapor phase epitaxy (MOVPE) process. The method is not limited to the MOVPE process, and a MBE (Molecular Beam Epitaxy) process or a LPE (Liguid Phase Epitaxy) process may be used.

Figure 4:
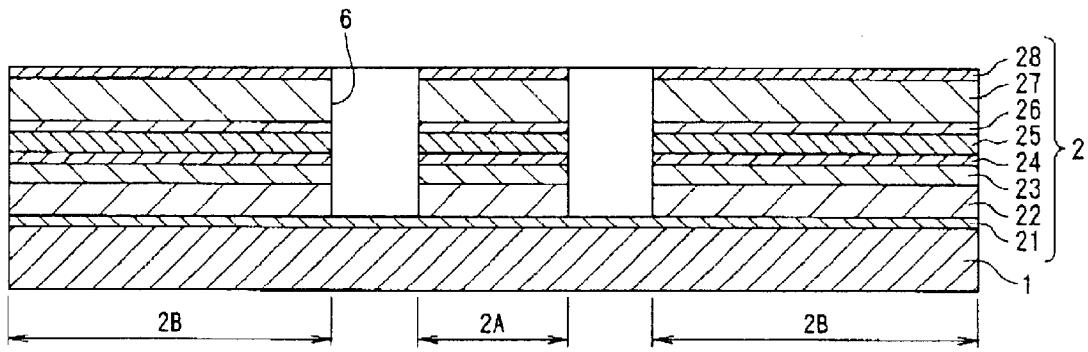
FIG. 4 is a sectional view illustrating a step for manufacturing the surface emitting laser according to the present invention.

Next, a photoresist is coated on the n-type contact layer 28, and then patterned by photolithography to form a resist layer having a predetermined pattern. Then, as shown in FIG. 4, the semiconductor stacked layers 2 are etched by reactive ion etching using the resist layer as a mask until the p-type contact layer 21 is exposed to form the ring-like recessed portion 6. As a result, the columnar light emitting portion 2A and the peripheral reinforcing portion 2B are formed in the semiconductor stacked layers 2 with the recessed portion 6 being provided between both portions.

Figure 5:
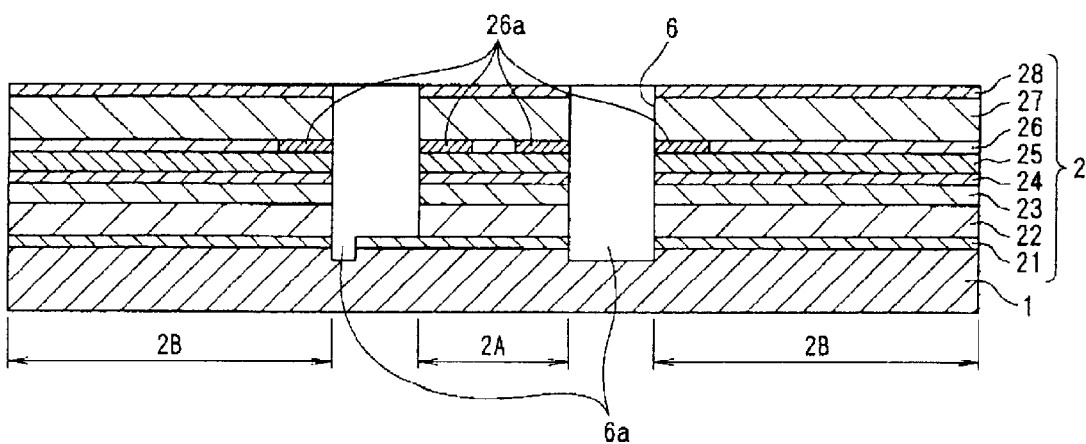
FIG. 5 is a sectional view illustrating a step for manufacturing the surface emitting laser according to the present invention.

Next, in order to leave a portion of contact between the p-type ohmic electrode 4 and the p-type contact layer 21 at the lower end of the light emitting portion 2A, a substantially rectangular resist layer is formed to extend from the periphery of the light emitting portion 2A to the outer periphery of the recessed portion 6 in the same manner as the previous step. Then, as shown in FIG. 5, etching is further performed to an intermediate position of the semiconductor substrate 1 by reactive ion etching using the resist layer as a mask to form the element isolation groove 6a in the recessed portion 6. Consequently, the p-type contact layer 21 remains in the substantially rectangular portion, where the resist layer was formed, while the groove 6a reaching the semiconductor substrate 1 is formed in the other exposed portion.

Next, the current narrowing layer 26 made of n-type AlAs is exposed to a water vapor atmosphere at about 400° C. for 1 to 30 minutes to oxidize the AlAs layer inward from the exposed surface, thereby forming the insulator layer 26a made of aluminum oxide around the semiconductor layer made of AlAs. The insulator layer 26a is formed in a ring shape in the periphery of the light emitting portion 2A except the central portion thereof, and in the periphery of the recessed portion 6.

Figure 6:
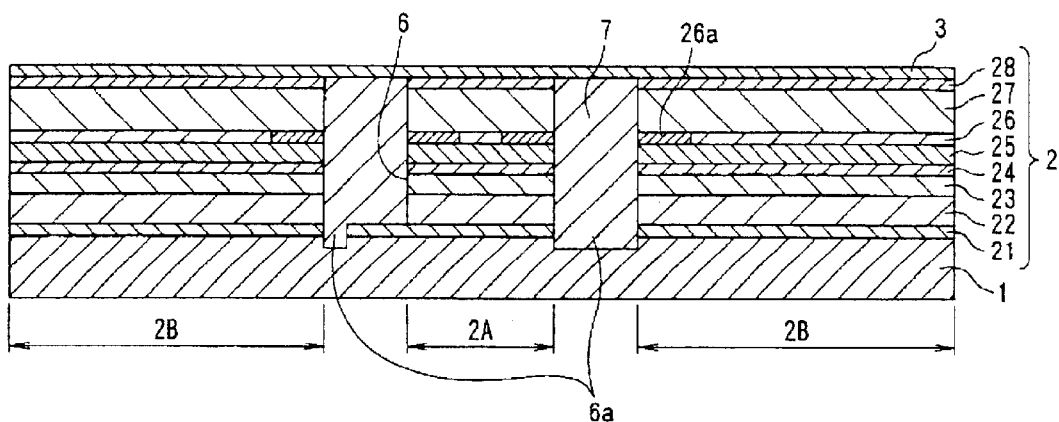
FIG. 6 is a sectional view illustrating a step for manufacturing the surface emitting laser according to the present invention.

Next, as shown in FIG. 6, a polyimide precursor, as the insulating material 7, is coated on the recessed portion 6 including the groove 6a formed by etching, and cured, and then the n-type contact layer 28 is exposed. Then, a silicon oxide film is formed over the entire surface by sputtering or the like. In this step, the recessed portion 6, including the groove 6a, is filled with polyimide as the insulating material 7. The polyimide precursor may be coated by any one of spin coating, dipping, spray coating, and the like.

Next, the silicon oxide film formed on the top of the light emitting portion 2A is etched off by photolithography and dry etching to form the insulating layer 3 on the top of the reinforcing portion 2B.

Figure 7:
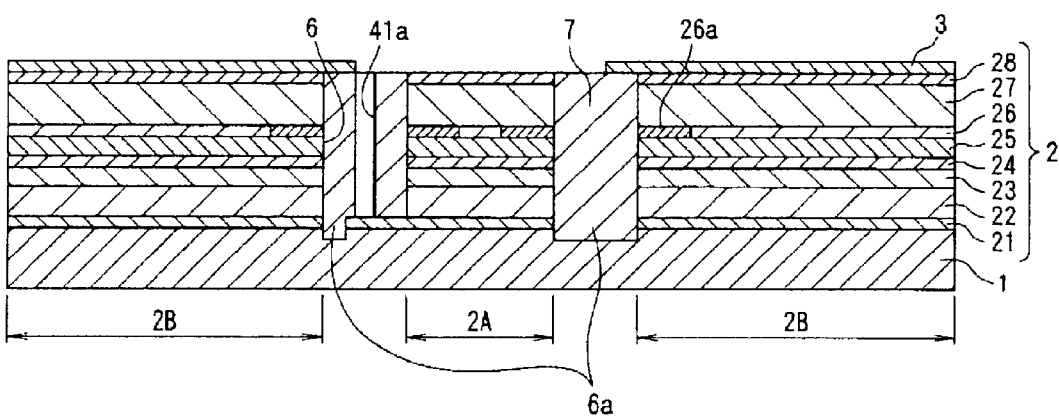
FIG. 7 is a sectional view illustrating a step for manufacturing the surface emitting laser according to the present invention.

Next, as shown in FIG. 7, the contact hole 41a is formed in the polyimide resin on the side (the left side of FIG. 7), where the p-type ohmic electrode 4 is formed, by photolithography and dry etching so as to vertically extend from the top of the semiconductor stacked layers 2 to the p-type contact layer 21 left in the recessed portion 6.

Figure 8:
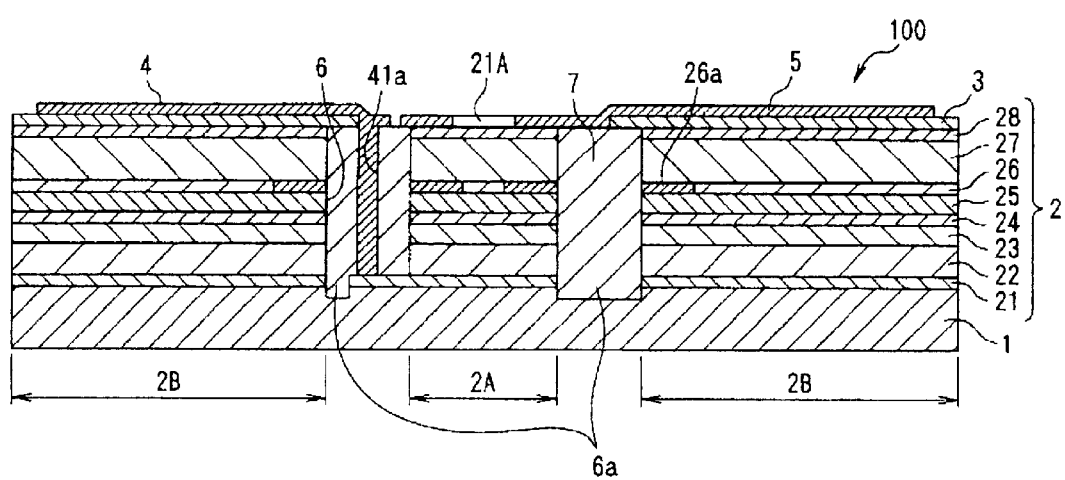
FIG. 8 is a sectional view illustrating a step for manufacturing the surface emitting laser according to the present invention.

Then, as shown in FIG. 8, a metal layer made of a metal of chromium and a gold-zinc alloy, or the like, is formed on the semiconductor stacked layers 2 by a vacuum deposition method, and then patterned by photolithography and dry etching to form the p-type ohmic electrode 4 having a predetermined pattern.

Next, a photoresist is coated on the top of the semiconductor stacked layers 2, and then patterned by photolithography using the photoresist to form a resist layer having a predetermined pattern. Then, a metal layer made of a metal, such as a gold-germanium alloy or the like, is formed on the upper surface of the resist layer by vacuum deposition, and the metal deposited on the upper surface of the resist layer is removed together with the resist layer by a liftoff method. In this step, the n-type ohmic electrode 5 having the opening 21A at the top of the light emitting portion 2A is formed. The surface emitting laser 100 of this embodiment is completed through the above-described steps.

On the other hand, the construction of the photodiode 200 according to the embodiment of the present invention is only different from the surface emitting laser 100 in the configuration of the semiconductor stacked layers 2. Therefore, the method of manufacturing the photodiode 200 is only different from the above-described manufacturing method in the stacked structure of the semiconductor stacked layers 2, and thus a detail description is omitted.

In this embodiment, only the periphery of the light emitting portion 2A or the light receiving portion 2C is etched off to leave the semiconductor stacked layers 2 as the reinforcing portion 2B in the other portion. However, the formation portion of the reinforcing portion 2B, the area of the formation portion, and the shape of the reinforcing portion 2B are not limited to those of the embodiment as long as the semiconductor stacked layers 2 are left at least at the bottom of the portion for mounting by flip chip bonding.

Although, in this embodiment, the p-type ohmic electrode 4 and the n-type ohmic electrode 5 have a circular planar shape, the shape of the electrodes is not limited to this shape, and any one of a triangular shape, a rectangular shape, and the like may be used.

Although, in this embodiment, the contact hole 41a is formed to enable conduction between the p-type ohmic electrode 4 and the lower end of the light emitting portion 2A or the light receiving portion 2C, the contact hole is not limited to this structure, and the p-type and n-type in this embodiment may be reversed as long as conduction between one of the electrodes and the lower end of the light emitting portion 2A or the light receiving portion 2C can be achieved.

Although, in this embodiment, the polyimide resin is used as the insulating meterial 7, the insulating material is not limited to this material, and any one of materials, such as acryl resins and epoxy resins, may be used.

Although, in the surface emitting laser 100 of this embodiment, a laser beam is emitted upward, light emission is not limited to this direction, and a laser beam may be emitted downward. Similarly, in the photodiode 200 of this embodiment, although a laser beam is incident from above, light incidence is not limited to this orientation, and a laser beam may incident from below.

Furthermore, a plurality of the surface emitting lasers 100 or the photodiodes 200 of this embodiment can be arranged in parallel to form a two-dimensional array. In this case, the p-type contact layers 21 of the light emitting portions 2A or the light receiving portions 2C of respective elements need not be isolated from each other, and a common electrod may be used. This structure can decrease the number of electrodes.

As described above, in a surface emitting laser of the invention or a photodiode of the invention, a pair of electrodes is formed on the upper surface of the reinforcing portion to have an external connecting portion, and thus secure fixing can be performed even in mounting by flip chip bonding, thereby providing a surface emitting laser or a photodiode having high reliability.

What is claimed is:

1. A surface emitting laser, comprising:

a semiconductor substrate;

semiconductor stacked layers stacked on the substrate and divided into a light emitting portion and a reinforcing portion by a recessed portion, the reinforcing portion having an upper surface;

an insulating material buried in the recessed portion; and a pair of electrodes that apply a voltage to pass a current in a thickness direction of the light emitting portion, the pair of electrodes having an external connecting portion formed on the upper surface of the reinforcing portion.

2. The surface emitting laser according to claim 1, one of the pair of electrodes being electrically connected to a lower end of the light emitting portion through a contact hole vertically extending in the insulating material.

3. The surface emitting laser according to claim 1, a bottom of the recessed portion reaching a surface of the semiconductor substrate over an entire length of the bottom in order to attain non-conduction between a lower end of the light emitting portion and a lower end of the reinforcing portion.

4. A optoelectric integrated circuit, comprising:

an optical waveguide;

a first mirror for incidence into the optical waveguide;

a second mirror for emission from the optical waveguide;

electric wiring;

a surface emitting laser including:
    a semiconductor substrate;
    semiconductor stacked layers stacked on the substrate and divided into a light emitting portion and a reinforcing portion by a recessed portion, the reinforcing portion having an upper surface;
    a first insulating material buried in the recessed portion; and
    a pair of electrodes that apply a voltage to pass a current in a thickness direction of the light emitting portion, the pair of electrodes having an external connecting portion formed on the upper surface of the reinforcing portion;

a laser driving circuit that drives the surface emitting laser;

a photodiode including:
    a semiconductor substrate;
    semiconductor stacked layers divided into a light receiving portion and a reinforcing portion by a recessed portion, the reinforcing portion having an upper surface;
    a second insulating material buried in the recessed portion; and
    a pair of electrodes that detect a current flowing in a thickness direction of the light receiving portion due to incidence of light, the pair of electrodes having an external connecting portion formed on the upper surface of the reinforcing portion; and an amplifier circuit that detects signals from the photodiode, the surface emitting laser, the laser driving circuit, the photodiode, and the amplifier circuit being mounted on the electric wiring by flip chip bonding.

* * * * *